(12) United States Patent
Hehemann et al.

(10) Patent No.: US 7,847,606 B2
(45) Date of Patent: Dec. 7, 2010

(54) HIGH PRECISION POWER-ON-RESET CIRCUIT WITH AN ADJUSTABLE TRIGGER LEVEL

(75) Inventors: Ingo Hehemann, Hagen a.T.W. (DE); Kwet Chai, Freising (DE); Michael Wendt, Wasserburg (DE)

(73) Assignee: Texas Instrumentsdeutschland GmbH, Freising (DE)

( * ) Notice: Subject to any disclaimer, the term of this patent is extended or adjusted under 35 U.S.C. 154(b) by 68 days.

(21) Appl. No.: 12/413,193

(22) Filed: Mar. 27, 2009

(65) Prior Publication Data

US 2009/0267682 A1 Oct. 29, 2009

Related U.S. Application Data

(60) Provisional application No. 61/141,543, filed on Dec. 30, 2008.

(30) Foreign Application Priority Data

Apr. 3, 2008 (DE) ........................ 10 2008 017 038

(51) Int. Cl.
*H03L 7/00* (2006.01)
(52) U.S. Cl. ...................................... 327/143
(58) Field of Classification Search ................ 327/530, 327/142, 143, 198
See application file for complete search history.

(56) References Cited

U.S. PATENT DOCUMENTS

| | | | |
|---|---|---|---|
| 5,485,111 A | 1/1996 | Tanimoto | |
| 5,920,182 A | 7/1999 | Migliavacca | |
| 5,959,477 A | 9/1999 | Chung | |
| 6,137,324 A | 10/2000 | Chung | |
| 6,144,238 A | 11/2000 | Dasgupta | |
| 6,239,630 B1 | 5/2001 | Bowers et al. | |
| 6,879,194 B1 * | 4/2005 | Caldwell | 327/143 |
| 7,417,476 B1 | 8/2008 | Hung | |
| 7,504,870 B2 * | 3/2009 | McClure et al. | 327/143 |
| 7,612,588 B2 * | 11/2009 | Kimura | 327/143 |
| 2005/0140406 A1 | 6/2005 | Rizzo et al. | |

FOREIGN PATENT DOCUMENTS

EP 0999493 5/1999

\* cited by examiner

*Primary Examiner*—Hai L Nguyen
(74) *Attorney, Agent, or Firm*—John J. Patti; Wade J. Brady, III; Frederick J. Telecky, Jr.

(57) ABSTRACT

An electronic device comprising circuitry for providing a Power-on-Reset (POR) signal as a function of a supply voltage level of the circuitry. The circuitry comprises a Vbe-cell or a Vgs-cell comprising a first current path including a first transistor and a second current path including a second transistor. Each transistor has a control terminal for controlling a first current in the first current path and a second current in the second current path, wherein a control voltage level is commonly applied to the control terminals of the first and the second transistor. The control voltage level is derived from the current supply voltage level of the circuitry, and the circuitry further comprises a POR output node for providing a POR output signal, which changes from a first state to a second state in response to the ratio of the magnitudes of the first current and the second current.

14 Claims, 5 Drawing Sheets

HIGH PRECISION POWER-ON-RESET CIRCUIT WITH AN ADJUSTABLE TRIGGER LEVEL

CROSS-REFERENCE TO RELATED APPLICATIONS

This application claims priority to German Patent Application Ser. No. 102008017038.0, entitled "A High Precision Power-on-Reset Circuit with Adjustable Trigger Level," filed on Apr. 3, 2008, which is hereby incorporated by reference for all purposes.

TECHNICAL FIELD

The invention relates generally to an electronic device and, more particularly, to a circuit that provides a power on reset signal as a function of a supply voltage level.

BACKGROUND

A Power-on-Reset circuit or POR circuit is generally used to issue a digital POR signal with respect to the supply voltage level of the circuitry in order to release or reset digital circuitry. If the supply voltage level is below a critical voltage level the digital circuitry is reset. If the critical voltage level is exceeded, the circuitry is released. Therefore, the POR circuitry monitors the supply voltage level and generates the POR signal as function of the monitored supply voltage level. Conventional POR circuits, such as circuit 100 of FIG. 1, has some disadvantages which become more relevant as voltage supply levels are reduced and tolerance margins are more limited. The rather simple circuit 100 comprises a resistor R0 that is coupled to a current mirror (which is generally comprised of diode-connect NMOS transistor NM1 and NMOS transistor NM2). Transistor NM2 is also coupled to a diode-connected PMOS transistor PM1. Transistors NM1 and PM1 are coupled at their drains to a CMOS inverter (which is generally comprised of NMOS transistor NM3 and PMOS transistor PM2) that provides the POR output signal PORout. The POR output signal PORout is typically used as a reset signal, which assumes a logic high or logic low level as function of the supply voltage level VDD. The supply voltage level VDD, at which the PORout signal changes state, is referred to as trigger voltage level. The trigger voltage level is defined by the dimensions (e.g., aspect ratios i.e. the width to length ratio (W/L ratio) of transistors, resistance of R0, and so forth). The trigger voltage level will typically depend on the threshold voltage levels of the MOSFET transistors as well. The properties of the components (as well as the whole circuit) are a subject to temperature and process variations, however. Therefore, the trigger voltage level of a conventional POR circuit, such as circuit 100, usually has a wide spread or variance (e.g., several hundreds millivolts). Furthermore, the trigger voltage level can not be set to an arbitrary value during operation.

Some examples of conventional circuits are: U.S. Patent Pre-Grant Publ. No. 2005/0140406, and U.S. Pat. Nos. 5,959,477; 6,137,324; 6,144,238; 6,239,630; and 7,417,476.

SUMMARY

A preferred embodiment of the present invention, accordingly, provides an electronic device. The electronic device generally comprises circuitry for providing a POR signal as a function of a supply voltage level of the circuitry. The circuitry comprises a Vbe-cell or a Vgs-cell. The cell includes a first current path including a first transistor and a second current path including a second transistor. Each transistor has a control terminal (e.g., a gate of a MOSFET or a base of a bipolar transistor) for controlling a first current in the first current path and a second current in the second current path. Furthermore, a control voltage level is commonly applied to the control terminals of the first and the second transistor. The control voltage level is derived from the current or instantaneous supply voltage level of the circuitry. The circuitry further comprises a POR output node for providing a POR output signal, which changes from a first state to a second state in response to the ratio of the magnitudes of the first current and the second current. Vbe-cell or a Vgs-cell typically forms part of a bias voltage generator, as for example, a bandgap voltage source. In a Vbe-cell or a Vgs-cell, the negative temperature coefficients of a bipolar transistor with respect to time or gate-source voltage ($V_{gs}$) of MOSFETS is compensated by a component (e.g., a resistor) having a positive temperature coefficient. Actually, the derivative of the base-emitter voltage ($V_{be}$) of a bipolar transistor with respect to time is negative. Likewise, the derivative of the gate-source voltage ($V_{be}$) of a MOS transistor with respect to time is negative. This physical property is used in a bias voltage source in order to generate a very stable and precise voltage. A control voltage level is applied to the transistors which is derived from the current supply voltage level of the circuitry.

The solution according to the present invention is based on the idea of controlling a precise bias voltage source (i.e., basically a Vbe-cell or a Vgs-cell), as, for example, used in a bandgap voltage source, with a control voltage applied to the bases or gates of the transistors. The POR output signal is then derived from the currents in current paths (e.g., two current paths) of the Vbe-cell or the Vgs-cell. The control voltage is derived from the supply voltage level of the circuitry thereby monitoring continuously the level of the supply voltage in a power up phase and during operation. Therefore, a bias voltage level of a bias voltage source is used as the input signal for a Vbe-cell or a Vgs-cell and the currents are the output signal. The currents in the current paths of the bias voltage source are then controlled in response to the control voltage applied to the control gates of the transistor in either of the current paths. It can be observed that the current ratio in the two current paths, such as the ratio of the magnitudes of the current in the first current path and the magnitude of the current in the second current path, swaps (i.e., there is a crossover of the magnitudes) when the supply voltage transitions a trigger voltage level. The trigger voltage level has a generally precise value and is generally stable over a large temperature range and various process variations. Furthermore, as there is typically a single crossover point of the magnitudes of the currents in the Vbe-cell or the Vgs-cell, the crossover point can advantageously be used to produce an output signal having two states, as required for a POR output signal. Therefore, bias voltage source can be used in an opposite direction, where the originally stable output voltage is used advantageously for defining a trigger voltage level for an input control signal and the ratio of the currents in the current paths are used the output signals.

Advantageously, the control voltage level can be generated by use of voltage divider. Therefore, a voltage divider can be coupled between the supply voltage level and ground for providing a control node having the control voltage level. This is an implementation with little complexity. Furthermore, by use of a voltage divider configuration, the control voltage level can be easily adjusted, by simple design measures or even during operation.

The circuitry in the electronic device according to a preferred embodiment of the present invention can further be adapted such that the first current is smaller than the second current as long as the supply voltage level remains below the trigger voltage level, and such that the first current is larger than the second current when the supply voltage transitions the trigger voltage level. The dimensions of the first transistor and the second transistor participate in defining the trigger voltage level, but the adjustment is preferably performed by adapting the control voltage level, such as the relationship between the supply voltage level and the control voltage level.

In accordance with a preferred embodiment of the present invention, the first transistor and the second transistor are bipolar transistors, and the control voltage level is the bandgap voltage level. Although not limited to a bandgap voltage source configuration, bipolar transistors are generally preferred, as the bandgap voltage level is generally more precise and stable voltage levels in integrated circuits. The transistor control gates are then the bases of the two bipolar transistors. The first transistor may then have a specific emitter area, which is n times the emitter area of the second transistor. The first transistor can be coupled through a resistor to an emitter of the second transistor.

In accordance with a preferred embodiment of the present invention, the electronic device can have a feedback connection from the POR output node to the control node for implementing a hysteresis. The hysteresis provides different trigger voltage levels with respect to a rising and a falling supply voltage. Since the control voltage level, which is applied to the control gates of the two transistors is preferably derived by a voltage divider from the current supply voltage level, this control voltage level can be easily adapted in order to provide a hysteresis. For example, a current can be fed into a node of the voltage divider, the magnitude of which is defined in response to the state of the POR output signal. The control voltage level can then, for example, be set to a higher voltage level, when the electronic device is switched on. When the supply voltage level has transitioned the trigger voltage level for a first time and the POR output signal has changed state, the voltage level can be reduced. This generally stabilizes the circuitry during operation and prevents that a reset signal is always issued if a small voltage drop at the supply voltage level occurs.

In accordance with a preferred embodiment of the present invention, it is generally possible to adjust the control voltage level by design measures or by adapting the voltage divider during operation. Therefore, the circuitry can become more flexible than conventional solutions and the circuitry can be used for a broader variety of applications with minor modifications.

In accordance with a preferred embodiment of the present invention, a method for providing a POR signal as a function of a supply voltage level of a circuitry is provided. According to the method, a first current in a first current path through a first transistor is controlled in response to a control voltage level at a control gate of the first transistor. According to the method a first current is controlled in a first current path through a first transistor of a Vbe-cell or a Vgs-cell in response to a control voltage level. Further, a second current in a second current path through a second transistor of the Vbe-cell or the Vgs-cell is controlled in response to the control voltage level at a control gate of the second transistor. The POR output signal of the circuitry is changed from a first state to a second state in response to a ratio of the magnitudes of the first current and the second current.

In accordance with a preferred embodiment of the present invention, the first transistor and the second transistor are bipolar transistors, and the control voltage level is the bandgap voltage level similar to the voltage generated in a bandgap voltage source. The method according to the present invention is based on the idea of controlling the control terminals of the transistors of a Vbe-cell or a Vgs-cell. The currents in the cell are used for providing a POR output signal.

In accordance with another preferred embodiment of the present invention, an apparatus is provided. The apparatus comprises a first current mirror; a second current mirror; a third current mirror that is coupled to the first and second current mirrors; a cell including: a first transistor having a first passive electrode, a second passive electrode, and a control electrode, wherein the first passive electrode of the first transistor is coupled the first current mirror; a second transistor having a first passive electrode, a second passive electrode, and a control electrode, wherein the first passive electrode of the second transistor is coupled to the second current mirror; and a first impedance network that is coupled to the second passive electrode of the first transistor and to the second passive electrode of the second transistor; and a second impedance network that is coupled to the control electrode of the first transistor and to the control electrode of the second transistor; and an output stage that is coupled to the second and third current mirrors.

In accordance with another preferred embodiment of the present invention, the first and second transistors are NPN transistors.

In accordance with another preferred embodiment of the present invention, the first and second transistors are NMOS transistors.

In accordance with another preferred embodiment of the present invention, the output stage further comprises a plurality of inverters coupled in series with one another.

In accordance with another preferred embodiment of the present invention, the first impedance network further comprises a first resistor that is coupled between the second control electrode of the first transistor and the second control electrode of the second transistor; and a second resistor that is coupled to the second control electrode of the first transistor.

In accordance with another preferred embodiment of the present invention, the second impedance network further comprises a first resistor that is coupled to the control electrode of the first transistor and to the control electrode of the second transistor; a second resistor that is coupled to the control electrode of the first transistor, to the control electrode of the second transistor, and to ground; a third resistor that is coupled to the control electrode of the first transistor and to the control electrode of the second transistor; and a PMOS transistor that is coupled to the third resistor at its drain.

In accordance with another preferred embodiment of the present invention, an apparatus is provided. The apparatus comprises a first voltage rail; a second voltage rail; a first PMOS transistor that is coupled to the first voltage rail at its source; a second PMOS transistor that is coupled to the first voltage rail at its source and that is coupled to the gate of the first PMOS transistor at its gate, wherein the second PMOS transistor is diode-connected; a third PMOS transistor that is coupled to the first voltage rail at its source, wherein the third PMOS transistor is diode-connected; a fourth PMOS transistor that is coupled to the first voltage rail at its source and that is coupled to the gate of the third PMOS transistor at its gate; a first NMOS transistor that is coupled to the second voltage rail at its source and that is coupled to the drain of the first PMOS transistor at its drain, wherein the first NMOS transistor is diode-connected; a second NMOS transistor that is coupled to the second voltage rail at its source, that is coupled to the gate of the first NMOS transistor at its gate, and that is coupled to the drain of the fourth PMOS transistor at its drain; a cell including: a first NPN transistor that is coupled to the source of the second PMOS transistor at its collector; a second NPN transistor that is coupled to the source of the third PMOS transistor at its collector; and a first impedance network that is coupled between the emitters of the first and second NPN transistors and the second voltage rail; and a second impedance network that is coupled to the bases of the first and second NPN transistors and that is coupled to the first and second voltage rails; and an output stage that is coupled to the drains of the fourth PMOS transistor and the second NMOS transistor.

In accordance with another preferred embodiment of the present invention, the output stage further comprises a first inverter having an input and an output, wherein the input of the first inverter is coupled to the sources of the fourth PMOS transistor and the second NMOS transistor; and a second inverter having an input and an output, wherein the input of the second inverter is coupled output of the first inverter.

In accordance with another preferred embodiment of the present invention, the second impedance network further comprises a first resistor that is coupled to the bases of the first and second NPN transistors and that is coupled to the first voltage rail; a second resistor that is coupled to the bases of the first and second NPN transistors and that is coupled to the second voltage rail; a third resistor that is coupled to the bases of the first and second NPN transistors; and a PMOS transistor that is coupled to the third resistor at its drain, that is coupled to the first voltage rail at its source, and that is coupled to the output of the second inverter at its gate.

In accordance with another preferred embodiment of the present invention, the first impedance network further comprises a first resistor that is coupled between the emitters of the first and second NPN transistors; and a second resistor that is coupled between the emitter of the first NPN transistor and the second voltage rail.

In accordance with another preferred embodiment of the present invention, an apparatus is provided. The apparatus comprises a first voltage rail; a second voltage rail; a first PMOS transistor that is coupled to the first voltage rail at its source; a second PMOS transistor that is coupled to the first voltage rail at its source and that is coupled to the gate of the first PMOS transistor at its gate, wherein the second PMOS transistor is diode-connected; a third PMOS transistor that is coupled to the first voltage rail at its source, wherein the third PMOS transistor is diode-connected; a fourth PMOS transistor that is coupled to the first voltage rail at its source and that is coupled to the gate of the third PMOS transistor at its gate; a first NMOS transistor that is coupled to the second voltage rail at its source and that is coupled to the drain of the first PMOS transistor at its drain, wherein the first NMOS transistor is diode-connected; a second NMOS transistor that is coupled to the second voltage rail at its source, that is coupled to the gate of the first NMOS transistor at its gate, and that is coupled to the drain of the fourth PMOS transistor at its drain; a cell including: a third NMOS transistor that is coupled to the source of the second PMOS transistor at its drain; a fourth NMOS transistor that is coupled to the source of the third PMOS transistor at its drain; and a first impedance network that is coupled between the sources of the first and second NMOS transistors and the second voltage rail; and a second impedance network that is coupled to the gates of the third and fourth NMOS transistors and that is coupled to the first and second voltage rails; and an output stage that is coupled to the drains of the fourth PMOS transistor and the second NMOS transistor.

In accordance with another preferred embodiment of the present invention, the second impedance network further comprises a first resistor that is coupled to the gates of the third and fourth NMOS transistors and that is coupled to the first voltage rail; a second resistor that is coupled to the gates of the third and fourth NMOS transistors and that is coupled to the second voltage rail; a third resistor that is coupled to the gates of the third and fourth NMOS transistors; and a PMOS transistor that is coupled to the third resistor at its drain, that is coupled to the first voltage rail at its source, and that is coupled to the output of the second inverter at its gate.

In accordance with another preferred embodiment of the present invention, the first impedance network further comprises a first resistor that is coupled between the drains of the gates of the third and fourth NMOS transistors; and a second resistor that is coupled between the drain of the first NMOS transistor and the second voltage rail.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
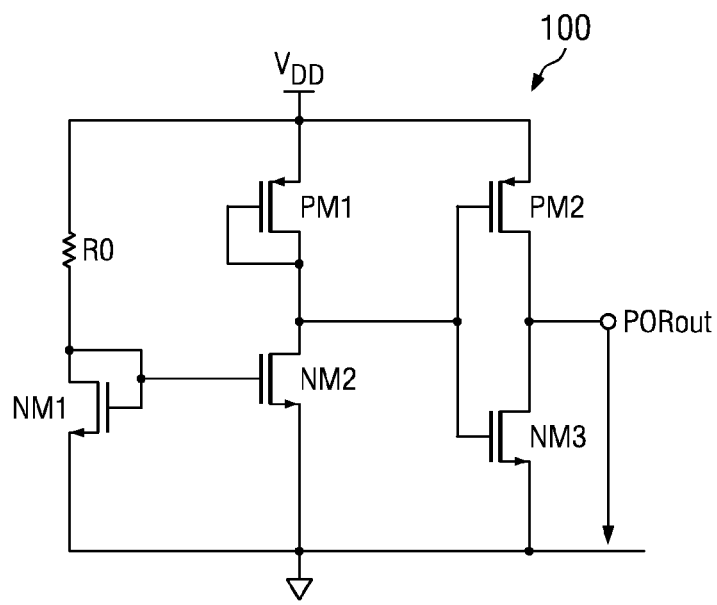
FIG. 1 is a circuit diagram of a conventional a Power-on-Reset (POR) circuit.

Refer now to the drawings wherein depicted elements are, for the sake of clarity, not necessarily shown to scale and wherein like or similar elements are designated by the same reference numeral through the several views.

Figure 2:
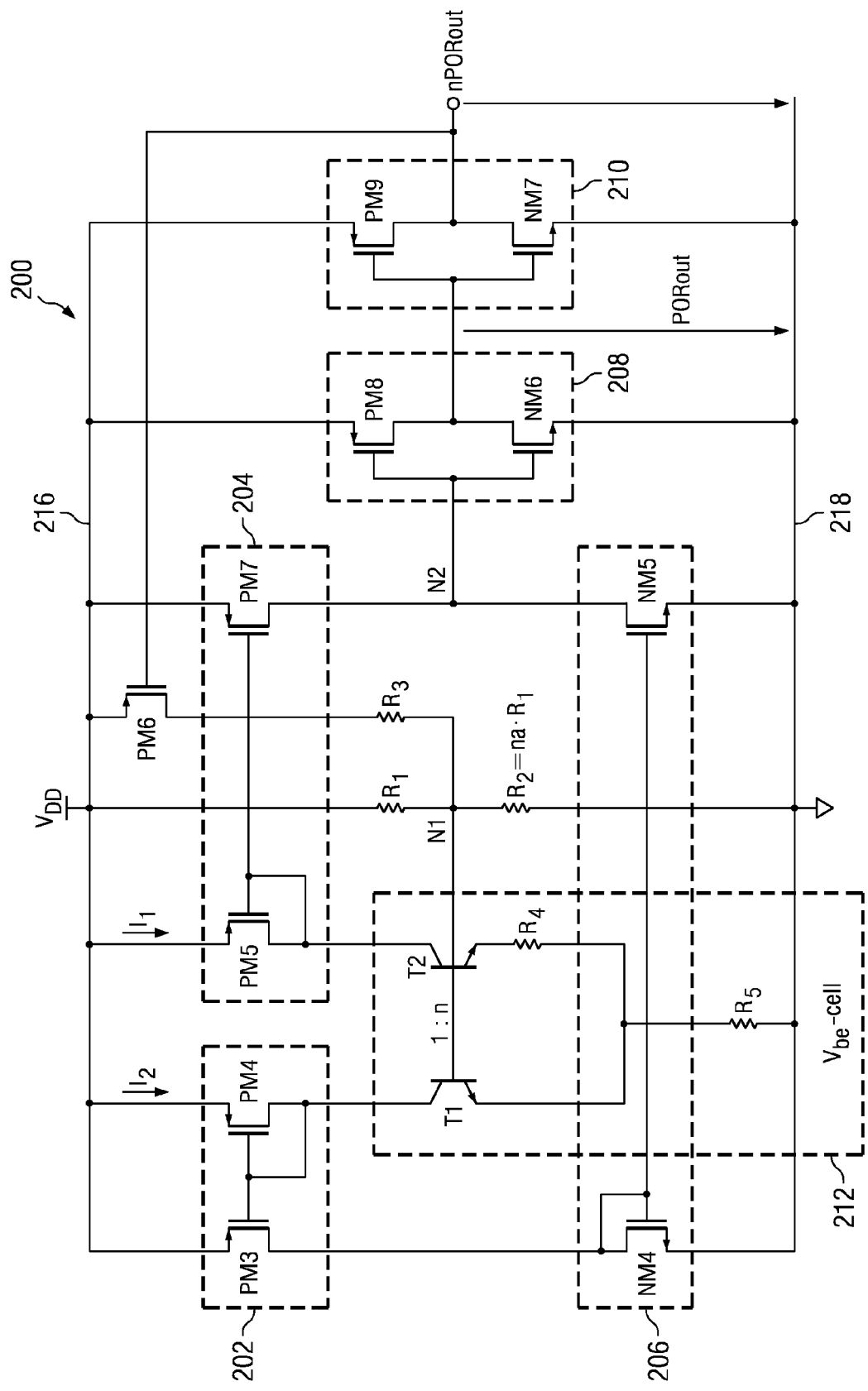
FIG. 2 is a circuit diagram of a POR circuit in accordance with a preferred embodiment of the present invention.
Figure 3:
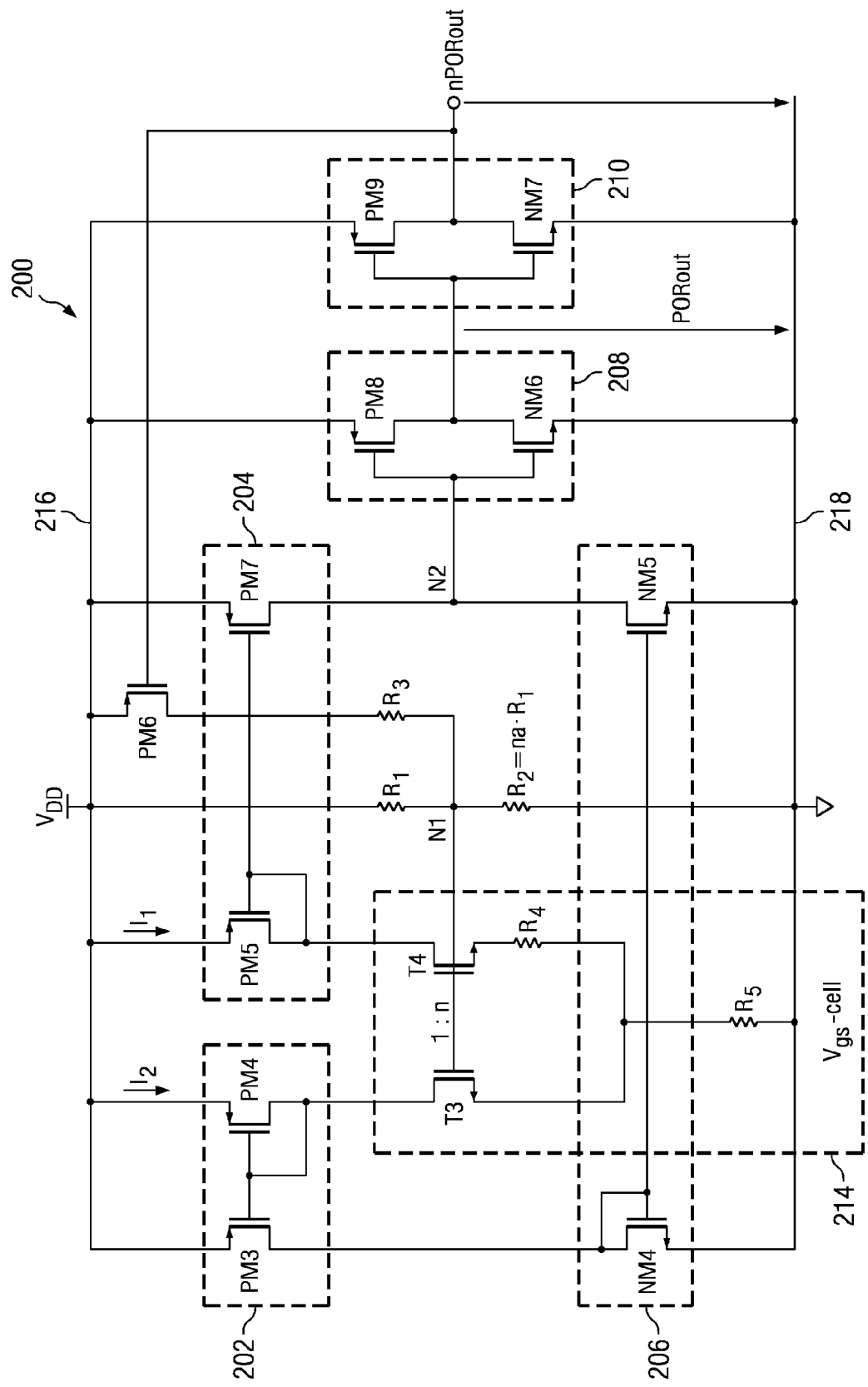
FIG. 3 is a circuit diagram of a POR circuit in accordance with a preferred embodiment of the present invention.

Referring to FIGS. 2 and 3 of the drawing, the reference numeral 200 generally designates a Power-on-Reset (POR) circuit in accordance with a preferred embodiment of the present invention. The circuit 200 generally comprises current mirrors 202, 204, and 206, inverters 208 and 210, an cell 212 (FIG. 2) or 214 (FIG. 3), and an impedance network or voltage divider (resistors R1, R2, and R3 and PMOS transistor PM6). Current mirror 202 is generally comprised of PMOS transistors PM3 and PM4 with transistor PM4 being diode-connected. Current mirror 204 is generally comprised of PMOS transistors PM5 and PM7 with transistor PM5 being diode-connected, and current mirror 206 is generally comprised of NMOS transistors NM4 and NM5 with transistor NM4 being diode-connected. Cell 212 is generally comprised of NPN transistors T1 and T2 and an impedance network or voltage divider (which is generally comprised of resistors R4 and R5), and cell 214 is generally comprised of NMOS transistors T3 and T4 and the impedance network or voltage divider (which is generally comprised of resistors R4 and R5).

In operation, cell 212 or 214 uses a difference in the base-source voltage ($V_{bs}$) or the gate-source voltage ($V_{gs}$) to operate by providing different current paths. The first current path provides a current I1 and includes NPN transistor T2 (or NMOS transistor T4) and resistor R4. The second current path provides a current I2 and includes NPN transistor T1. The first and the second current path share resistor R5. A voltage divider or impedance network is coupled to the supply voltage level VDD at a first voltage rail 216 and ground at a second voltage rail 218 and provides a control voltage level at a control node N1. Additionally, the value of resistor R2 can be na times R1 (which are within the voltage divider or impedance network). The first current I1 and the second current I2 are used for generating the POR output signal. Therefore, I1 is mirrored through current mirrors 202 and 204 to transistor NM5. The second current I2 is mirrored through current mirrors 202 and 206 into transistor NM5. Transistors NM5 and PM7 are configured such that the voltage level at node n2 (i.e., at the drains of transistors NM5 and PM7) rises, if the first current I1 is greater than the second current I2. If the second current I2 is greater than the first current I1, the voltage level at node N2 is low. Further, there are two CMOS inverters 208 and 210, which include transistors NM6, PM8 and NM7, PM9, respectively. The POR output signal PORout is provided at an output node of the circuit or at the output of inverter 208.

The two CMOS inverters are generally provided in order to shape the output signal nPORout. When the supply voltage level VDD starts rising, for example, at 0 V, the first current I1 is greater than the second current I2. This is due to the multiplication factor of the first bipolar transistor T1 (or MOS transistor T3) and the second bipolar transistor T2 (or MOS transistor T4). The multiplication factor is generally one-to-n (1:n), which indicates that the emitter (or source) area of transistor T2 (or transistor T4) is n times the emitter (or source) area of transistor T1 (or transistor T4).

When the supply voltage level VDD increases further, the voltage at the divider node N1 increases too, and the magnitude of the first current I1 approximates the magnitude of the second current I2. When the circuit 200 is properly dimensioned, the magnitude of the first current I1 and the magnitude of the second current I2 will be equal, when the voltage level at the divider node N1 reaches a predetermined voltage level, which is based on or equal to the bandgap voltage level. If the supply voltage level exceeds the trigger voltage level, the control voltage level exceeds the predetermined voltage level. The magnitude of the second current I2 will exceed the magnitude of the first current. The currents I1 and I2 are mirrored into transistors NM5 and PM7. Transistors NM5 and PM7 are dimensioned so as to generate the POR output signal PORout with respect to the crossover of the two currents I1 and I2 (i.e., with respect to moment when the magnitudes are generally equal).

Since the voltage level at the divider node N1 is generated by a resistive divider (which includes resistors R1 and R2), the required supply voltage level at which the voltage level at divider node N1 reaches the bandgap voltage level $V_{bg}$ (i.e. if the supply voltage level VDD is equal to the trigger voltage level $V_{trig}$) can be easily adjusted. If, for example, the ratio of the resistance values of resistor R1 and R2 are chosen to R2=na*R1, the parameter a is given by:

$$na = \frac{V_{bg}}{V_{trig} - V_{bg}}, \qquad (1)$$

wherein $V_{bg}$ is the bandgap voltage level and $V_{trig}$ is the trigger voltage level. The feedback connection from the output signal nPORout through transistor PM6 and resistor R3 to divider node N1 provides a hysteresis, which renders the circuitry less sensitive with respect to noise. The change in the voltage trigger level $\Delta V_{trig}$ is determined by equation 2:

$$\Delta V_{trig} = V_{bg}\left(\frac{1}{a} - \frac{R_3}{a(R_1 + R_3)}\right). \qquad (2)$$

Figure 4:
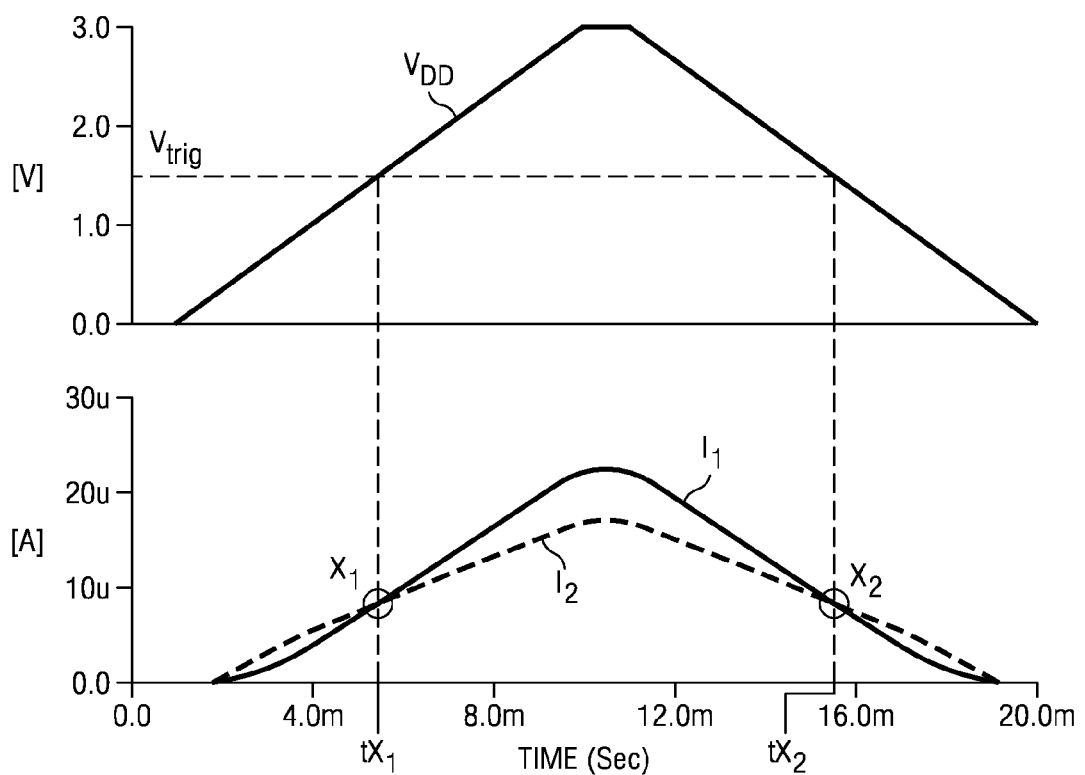
FIG. 4 generally depicts shows waveforms relating to a transient response of the POR circuit of FIG. 2 or 3.

FIG. 4 shows the magnitude of the first current I1 and the second current I2 in response to the supply voltage level VDD over time without hysteresis. These are the possible currents in current paths of the ΔVbe-cell (cell 212) or the ΔVgs-cell (cell 214). As can be seen in FIG. 4, the supply voltage level VDD starts at 0 V and rises linearly up to 3 V. After remaining at 3 V, the supply voltage level VDD falls linearly until it reaches again 0 V. Each time the trigger voltage level $V_{trig}$ is reached and transitioned, the POR output signal PORout shown in FIG. 2 changes its state. The influence of the hysteresis is not shown. The magnitudes of the first current I1 and the second current I2 are shown in FIG. 4 in the diagram below the supply voltage level VDD. The currents I1 and I2 have two cross-over points X1 and X2. The first cross-over occurs at time tX1 and the second cross-over occurs at time tX2. Between tX1 and tX2, the magnitude of the first current I1 is greater than the magnitude of the second current I2. Before tX1 and after tX2, the magnitude of the first current I1 is smaller than the magnitude of the second current I2. At tX1 and at tX2, the supply voltage level reaches a voltage level of approximately 1.5 V. The resistors R1 and R2 are adjusted such that the voltage level at divider node N1 reaches exactly the bandgap voltage $V_{bg}$ at time tX1 and at time tX2.

Figure 5:
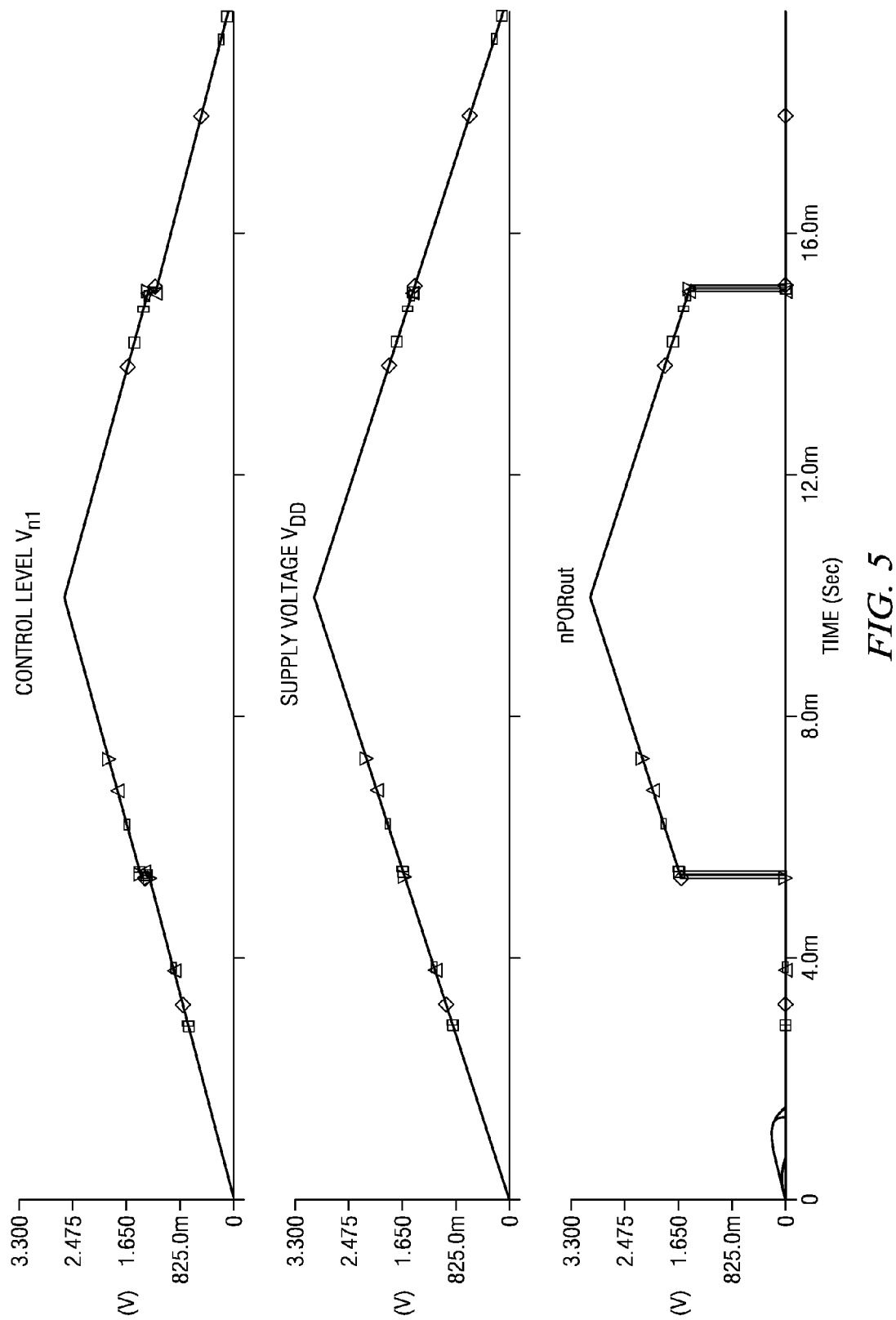
FIG. 5 generally depicts waveforms relating to a transient response of the POR circuit of FIG. 2 or 3.

FIG. 5 shows further waveforms of voltage levels relating to circuit 200. The upper diagram shows the voltage level Vn1 at node n1 for a rising and falling supply voltage level VDD as shown in the middle diagram. The lower diagram shows the output signal nPORout as a function of the supply voltage VDD. Each of the three diagrams shows six overlaid waveforms, each of which relates to a different parameter setting known as corner analysis.

Figure 6:
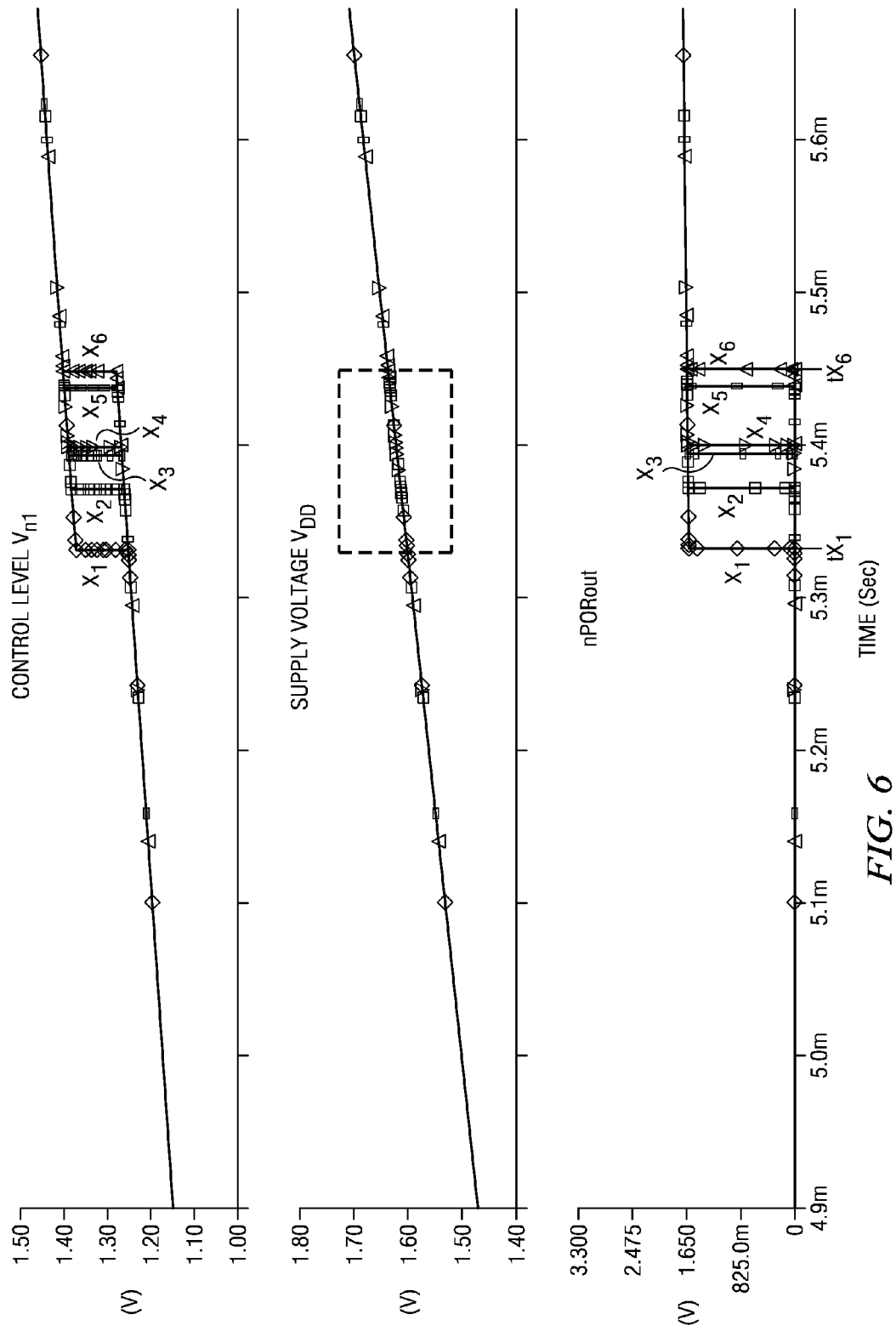
FIG. 6 generally depicts waveforms relating to a transient response of the POR circuit of FIG. 2 or 3.

FIG. 6 shows the waveforms of FIG. 5 in more detail. The three diagrams relate to the control voltage level Vn1 at node N1 and the output signal nPORout as functions of the supply voltage level VDD having a waveform as shown in the middle diagram. FIG. 6 shows in particular the dependency of the output voltage nPORout of the circuit 200. The upper and lower diagrams show six different waveforms X1 to X6 of the control voltage level Vn1 and the output signal nPORout for process corners of a sample technology of the same circuitry shown in FIG. 2. Although the process parameters are varied, the voltage level at time tX1 and at time tX6 varies only slightly between 1.599 V and 1.635 V. Also, the control voltage level Vn1 varies only slightly as a function of process and temperature variations.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
    a first current mirror;
    a second current mirror;
    a third current mirror that is coupled to the first and second current mirrors;
    a cell including:
        a first transistor having a first passive electrode, a second passive electrode, and a control electrode, wherein the first passive electrode of the first transistor is coupled the first current mirror;
        a second transistor having a first passive electrode, a second passive electrode, and a control electrode, wherein the first passive electrode of the second transistor is coupled to the second current mirror; and
        a first impedance network that is coupled to the second passive electrode of the first transistor and to the second passive electrode of the second transistor; and
    a second impedance network that is coupled to the control electrode of the first transistor and to the control electrode of the second transistor; and
    an output stage that is coupled to the second and third current mirrors.

2. The apparatus of claim 1, wherein the first and second transistors are NPN transistors.

3. The apparatus of claim 1, wherein the first and second transistors are NMOS transistors.

4. The apparatus of claim 1, wherein the output stage further comprises a plurality of inverters coupled in series with one another.

5. The apparatus of claim 1, wherein the first impedance network further comprises:
    a first resistor that is coupled between the second control electrode of the first transistor and the second control electrode of the second transistor; and
    a second resistor that is coupled to the second control electrode of the first transistor.

6. The apparatus of claim 1, wherein the second impedance network further comprises:
    a first resistor that is coupled to the control electrode of the first transistor and to the control electrode of the second transistor;
    a second resistor that is coupled to the control electrode of the first transistor, to the control electrode of the second transistor, and to ground;
    a third resistor that is coupled to the control electrode of the first transistor and to the control electrode of the second transistor; and
    a PMOS transistor that is coupled to the third resistor at its drain.

7. An apparatus comprising:
    a first voltage rail;
    a second voltage rail;
    a first PMOS transistor that is coupled to the first voltage rail at its source;
    a second PMOS transistor that is coupled to the first voltage rail at its source and that is coupled to the gate of the first PMOS transistor at its gate, wherein the second PMOS transistor is diode-connected;
    a third PMOS transistor that is coupled to the first voltage rail at its source, wherein the third PMOS transistor is diode-connected;
    a fourth PMOS transistor that is coupled to the first voltage rail at its source and that is coupled to the gate of the third PMOS transistor at its gate;
    a first NMOS transistor that is coupled to the second voltage rail at its source and that is coupled to the drain of the first PMOS transistor at its drain, wherein the first NMOS transistor is diode-connected;
    a second NMOS transistor that is coupled to the second voltage rail at its source, that is coupled to the gate of the first NMOS transistor at its gate, and that is coupled to the drain of the fourth PMOS transistor at its drain;
    a cell including:
        a first NPN transistor that is coupled to the source of the second PMOS transistor at its collector;
        a second NPN transistor that is coupled to the source of the third PMOS transistor at its collector; and
        a first impedance network that is coupled between the emitters of the first and second NPN transistors and the second voltage rail; and
    a second impedance network that is coupled to the bases of the first and second NPN transistors and that is coupled to the first and second voltage rails; and
    an output stage that is coupled to the drains of the fourth PMOS transistor and the second NMOS transistor.

8. The apparatus of claim 7, wherein the output stage further comprises:
    a first inverter having an input and an output, wherein the input of the first inverter is coupled to the sources of the fourth PMOS transistor and the second NMOS transistor; and
    a second inverter having an input and an output, wherein the input of the second inverter is coupled output of the first inverter.

9. The apparatus of claim 8, wherein the second impedance network further comprises:
    a first resistor that is coupled to the bases of the first and second NPN transistors and that is coupled to the first voltage rail;
    a second resistor that is coupled to the bases of the first and second NPN transistors and that is coupled to the second voltage rail;
    a third resistor that is coupled to the bases of the first and second NPN transistors; and
    a PMOS transistor that is coupled to the third resistor at its drain, that is coupled to the first voltage rail at its source, and that is coupled to the output of the second inverter at its gate.

10. The apparatus of claim 7, wherein the first impedance network further comprises:
    a first resistor that is coupled between the emitters of the first and second NPN transistors; and
    a second resistor that is coupled between the emitter of the first NPN transistor and the second voltage rail.

11. An apparatus comprising:
    a first voltage rail;
    a second voltage rail;
    a first PMOS transistor that is coupled to the first voltage rail at its source;
    a second PMOS transistor that is coupled to the first voltage rail at its source and that is coupled to the gate of the first PMOS transistor at its gate, wherein the second PMOS transistor is diode-connected;

a third PMOS transistor that is coupled to the first voltage rail at its source, wherein the third PMOS transistor is diode-connected;
a fourth PMOS transistor that is coupled to the first voltage rail at its source and that is coupled to the gate of the third PMOS transistor at its gate;
a first NMOS transistor that is coupled to the second voltage rail at its source and that is coupled to the drain of the first PMOS transistor at its drain, wherein the first NMOS transistor is diode-connected;
a second NMOS transistor that is coupled to the second voltage rail at its source, that is coupled to the gate of the first NMOS transistor at its gate, and that is coupled to the drain of the fourth PMOS transistor at its drain;
a cell including:
   a third NMOS transistor that is coupled to the source of the second PMOS transistor at its drain;
   a fourth NMOS transistor that is coupled to the source of the third PMOS transistor at its drain; and
   a first impedance network that is coupled between the sources of the first and second NMOS transistors and the second voltage rail; and
a second impedance network that is coupled to the gates of the third and fourth NMOS transistors and that is coupled to the first and second voltage rails; and
an output stage that is coupled to the drains of the fourth PMOS transistor and the second NMOS transistor.

12. The apparatus of claim 11, wherein the output stage further comprises:
   a first inverter having an input and an output, wherein the input of the first inverter is coupled to the sources of the fourth PMOS transistor and the second NMOS transistor; and
   a second inverter having an input and an output, wherein the input of the second inverter is coupled output of the first inverter.

13. The apparatus of claim 12, wherein the second impedance network further comprises:
   a first resistor that is coupled to the gates of the third and fourth NMOS transistors and that is coupled to the first voltage rail;
   a second resistor that is coupled to the gates of the third and fourth NMOS transistors and that is coupled to the second voltage rail;
   a third resistor that is coupled to the gates of the third and fourth NMOS transistors; and
   a PMOS transistor that is coupled to the third resistor at its drain, that is coupled to the first voltage rail at its source, and that is coupled to the output of the second inverter at its gate.

14. The apparatus of claim 11, wherein the first impedance network further comprises:
   a first resistor that is coupled between the drains of the gates of the third and fourth NMOS transistors; and
   a second resistor that is coupled between the drain of the first NMOS transistor and the second voltage rail.

* * * * *